US010333478B1

(12) United States Patent
Snoeij et al.

(10) Patent No.: US 10,333,478 B1
(45) Date of Patent: Jun. 25, 2019

(54) SLEW BOOST DISABLE FOR AN OPERATIONAL AMPLIFIER

(71) Applicant: TEXAS INSTRUMENTS INCORPORATED, Dallas, TX (US)

(72) Inventors: Martijn Fridus Snoeij, Erding (DE); Sudarshan Udayashankar, Marzling (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/848,808

(22) Filed: Dec. 20, 2017

(51) Int. Cl.
*H03F 3/45* (2006.01)
*H03F 3/16* (2006.01)

(52) U.S. Cl.
CPC ......... *H03F 3/45089* (2013.01); *H03F 3/165* (2013.01); *H03F 3/45188* (2013.01); *H03F 2203/45061* (2013.01); *H03F 2203/45248* (2013.01)

(58) Field of Classification Search
CPC .. H03F 3/45089; H03F 3/45188; H03F 3/165; H03F 2203/45248; H03F 2203/45061; H03F 3/45085; H03F 1/3211; H03F 3/45071; H03F 3/45; H03F 3/45076; H03F 3/4508; H03F 2203/45138; H03F 3/45183; H03F 3/45179; H03F 3/45192; H03F 2200/177
USPC .......................................... 330/252, 253, 257
See application file for complete search history.

(56) References Cited

U.S. PATENT DOCUMENTS

| 6,437,645 B1 * | 8/2002 | Ivanov | H03F 3/3028 330/255 |
| 7,471,150 B2 * | 12/2008 | Alenin | H03F 1/26 330/255 |
| 8,390,379 B2 | 3/2013 | Snoeij | |
| 9,054,657 B2 * | 6/2015 | Kumar | H03F 3/45179 |
| 2006/0220741 A1 * | 10/2006 | Jones | H03F 3/45192 330/253 |

\* cited by examiner

*Primary Examiner* — Khanh V Nguyen
(74) *Attorney, Agent, or Firm* — John R. Pessetto; Charles A. Brill; Frank D. Cimino

(57) ABSTRACT

An input stage of an operational amplifier receives first and second input voltages. An output slew detection circuit decreases a first current responsive to slewing of an output of the operational amplifier and increases the first current responsive to no slewing. A slew boost and differential input voltage detection generates a second current at a first level when the first and second input voltages are approximately equal and to generate the second current at a second level, smaller than the first level, responsive to the first and second input voltages not being approximately equal. A voltage on a capacitor increases responsive to the first current from the output slew detection circuit increasing and responsive to the second current being at the second level. A current mirror is activated responsive to the voltage on the capacitor exceeding a second threshold. The current mirror decreases a third current of the input stage.

18 Claims, 3 Drawing Sheets

US 10,333,478 B1

SLEW BOOST DISABLE FOR AN OPERATIONAL AMPLIFIER

BACKGROUND

An operational amplifier is an amplifier that includes a differential input. At a steady state, the voltage on the input terminals of an operational amplifier are relatively the same. If one of the input terminals receives a sudden change in its voltage, due to capacitors internal to the operational amplifier, there will be a momentary period of time in which the input terminals experience different voltages. Eventually, however, the feedback associated with the circuit in which the operational amplifier is used causes the voltage on the input terminals again approximately match each other. During the transient period of time the output voltage ramps up or down depending on whether the input has increased or decreased and depending on the configuration of the operational amplifier as an inverting amplifier or a non-inverting amplifier. The rate of change of the output voltage is referred to as the slew rate and is a function of various components within the operational amplifier such as compensation capacitors.

SUMMARY

In one example, an operational amplifier includes an input stage configured to receive a first input voltage and a second input voltage, an output slew detection circuit configured to increase a first current responsive to slewing of an output voltage of the operational amplifier and to decrease the first current responsive to the output voltage not slewing, and a slew boost and differential input voltage detection circuit coupled to the input stage and configured to generate a second current at a first level responsive to the first and second input voltages not being different by more than a first threshold voltage and to generate the second current at a second level, smaller than the first level, responsive to the first and second input voltages being different by more than the first threshold voltage. The operational amplifier also includes a first capacitor coupled to the output slew detection circuit and the slew boost circuit and a first current mirror coupled to the first capacitor. A voltage on the first capacitor is configured to increase responsive to the first current from the output slew detection circuit increasing and separately responsive to the second current being at the second level. The first current mirror is configured to be turned on responsive to the voltage on the first capacitor exceeding a second threshold. Once turned on, the first current mirror is configured to cause a third current of the input stage to decrease.

In another example, a circuit includes a first transistor configured to receive a first input voltage, a second transistor configured to receive a second input voltage, and a first current mirror coupled to the first and second transistors. The circuit further includes a second current mirror coupled to the first current mirror and a first capacitor coupled to the second current mirror. A third current mirror is coupled to the first capacitor. An output slew detection circuit is coupled to the third current mirror. The output slew detection circuit is configured to control a magnitude of a current through the third current mirror responsive to whether an output voltage of the circuit is slewing.

In yet another example, a circuit includes an output slew detection circuit configured to increase a first current responsive to slewing of an output voltage of an operational amplifier and to decrease the first current responsive to the output voltage not slewing. The circuit also includes a slew boost and differential input voltage detection circuit configured to be coupled to an input stage of the operational amplifier and configured to generate a second current at a first level responsive to the first and second input voltages not being different by more than a first threshold voltage and to generate the second current at a second level, smaller than the first level, responsive to the first and second input voltages being different by more than the first threshold voltage. A first capacitor is coupled to the output slew detection circuit and the slew boost circuit. A first current mirror is coupled to the first capacitor. A voltage on the first capacitor is configured to decrease responsive to the first current from the output slew detection circuit increasing and separately responsive to the second current being at the second level. The first current mirror is configured to be turned on responsive to the voltage on the first capacitor exceeding a second threshold. Once turned on, the first current mirror is configured to cause a third current of the input stage to decrease.

BRIEF DESCRIPTION OF THE DRAWINGS

For a detailed description of various examples, reference will now be made to the accompanying drawings in which.

DETAILED DESCRIPTION

The disclosed embodiments are directed to circuits usable in an operational amplifier. The disclosed operational amplifier includes a slew boost circuit that increases the current through the input stage of the operational amplifier to thereby increase the slew rate of the output voltage of the operational amplifier. The slew boost circuit detects a voltage difference across the inputs to the operational amplifier. In response, the slew boost circuit increases the current flow through an input differential transistor pair of the operational amplifier with larger potential differences across the inputs. In other embodiment, the slew boost circuit may detect a voltage difference of more than a threshold voltage across the inputs to the operational amplifier (indicative of step voltage change in one of the inputs) and, in response, increases the current flow through the input differential transistor pair of the operational amplifier.

However, it is possible that the input voltage to the operational amplifier is forced to be large enough that due to the gain of the operational amplifier, the output hits the power rail. The output voltage from the operational amplifier cannot exceed the power rail and thus will be stuck at, or approximately at, the power rail. In that state, a voltage difference between the input terminals of the operational amplifier will persist as the feedback voltage derived from the output voltage (and provided to an input terminal of the operational amplifier) is not permitted to match the input voltage on the other input terminal of the operational amplifier. The slew boost circuit will continue to provide for an increased current flow through the input stage of the operational amplifier because the voltages on the input terminals are different, but the slew boost circuit provides no added benefit in terms of increasing the slew rate. To avoid excessive current draw by the slew rate boost circuit in this state, the disclosed embodiments include slew boost disable circuits that detect this condition and disables slew boost operation.

Figure 1:
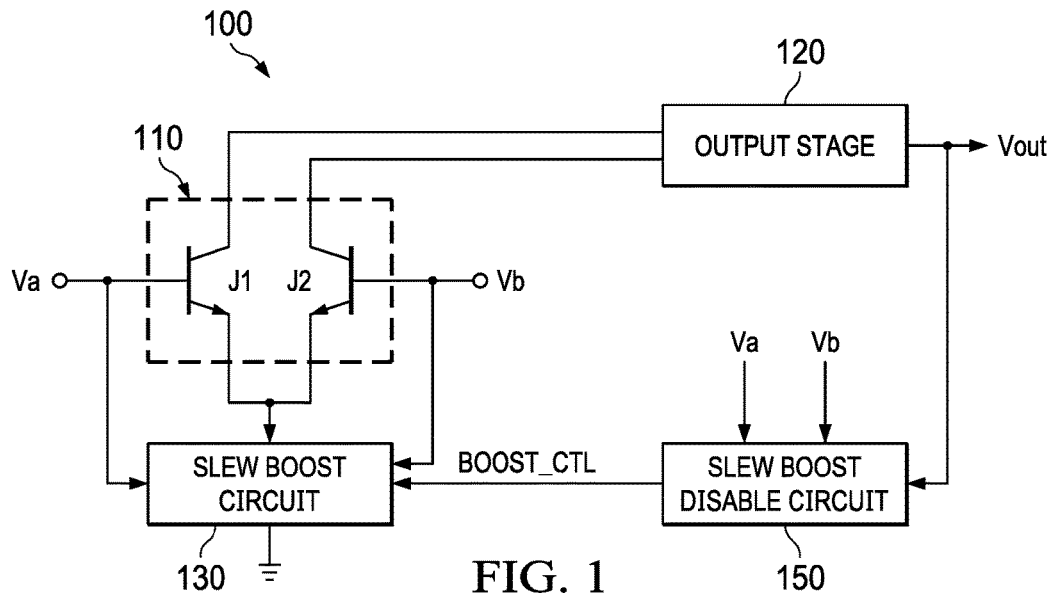
FIG. 1 illustrates an operational amplifier including a slew boost circuit and a slew boost disable circuit in accordance with an example.

FIG. 1 shows an example of an operational amplifier 100 in accordance with an embodiment. The operational amplifier 100 includes a differential input pair of transistors 110, an output stage 120, a slew boost circuit 130, and a slew boost disable circuit 150. The differential input pair of transistors 110 comprises NPN transistors J1 and J2, although other transistor types can be used as well (e.g., metal oxide semiconductor (MOS) devices). The control input (base) of J1 receives a first input voltage (Va), and the control input of J2 receives a second input voltage Vb). Va and Vb may comprise the "+" and "−" inputs to the operational amplifier 100. The output stage 120 is coupled to the differential input pair of transistors 110. The output stage 120 may comprise additional transistors and other components and produces an output voltage Vout.

The slew boost circuit 130 is coupled to the differential input pair of transistors 110 and, in one example, causes current through J1 and J2 to increase in the event that Va is more than a first threshold voltage different from Vb, regardless of whether Va is greater than or less than Vb. If Va is not more than the first threshold voltage different from Vb (i.e., Va is approximately equal to Vb), then the slew boost circuit 130 in this example does not increase the current through the differential input transistor pair 110 and the current through the differential input transistor pair 110 remains at a lower, quiescent level.

The slew boost disable circuit 150 asserts a BOOST_CTL control signal to the slew boost circuit 130 to disable the slew boost circuit 130 upon detecting that both (a) Va is more than the threshold voltage different from Vb and (b) the output voltage Vout is not slewing (e.g., Vout is failing to change by more than a second threshold rate). In one example, Vout is determined not to be slewing if the rate of change of Vout with respect to time is less than approximately 5V per microsecond. If the slew boost disable circuit 150 detects that Vout is not slewing despite Va being more than the first threshold voltage different than Vb, then the output voltage Vout has likely reached a power rail and cannot change any further. The slew boost disable circuit 150 responds by disabling the slew boost circuit 130.

Figure 2:
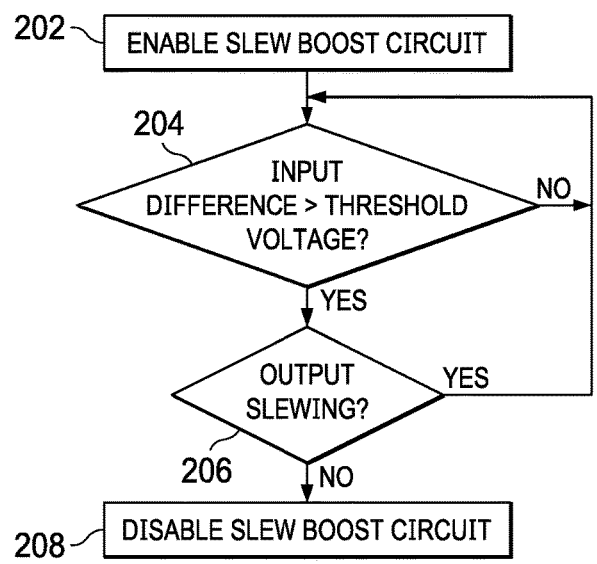
FIG. 2 shows a method of disabling the slew boost circuit of FIG. 1.

FIG. 2 shows an example of a method for controlling the slew boost circuit 130 in accordance with an example. At 202, the slew boost circuit is enabled. This operation may be performed by setting the state of the BOOST_CTL control signal to a low (or high) signal level. At 204, the method includes determining whether the difference between Va and Vb is more than a threshold voltage different from Vb (e.g., the first threshold voltage noted above). If Va is not more than the threshold voltage different from Vb, then control loops back to 204. If, however, Va is more than the threshold voltage different from Vb, then at 206, the method includes determining whether the output voltage Vout is slewing. This operation may include determining whether the rate of change of Vout with respect to time is less than a threshold rate (e.g., 5V per microsecond) which indicates an absence of slewing or more than the threshold which indicates the presence of slewing.

If the output is not slewing, then at 208, the slew boost circuit 130 is disabled (e.g., by changing the state of the BOOST_CTL control signal to a logic high (or low) signal level. If the output is slewing (the "yes" branch from 206), then the slew boost circuit 130 is not disabled and control loops back to 204. In some embodiments, the BOOST_CTL signal may comprise a current configured to be at one of two levels to cause the slew boost circuit 130 to be enabled or disabled. In other embodiments, the BOOST_CTL signal is a voltage that specifies whether the slew boost circuit 130 is to be enabled or disabled. In some examples, the BOOST_CTL signal comprises two distinct currents.

Figure 3:
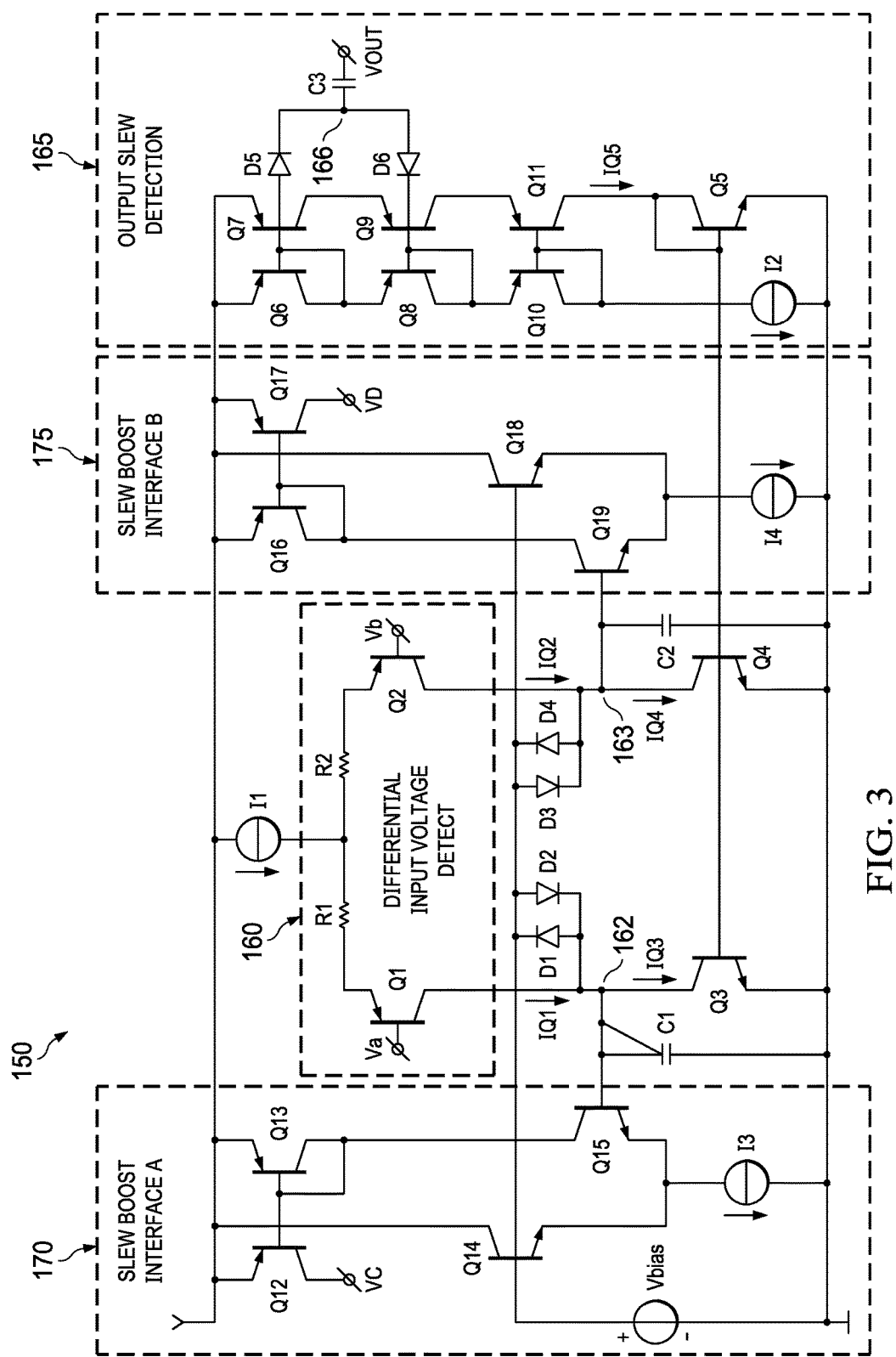
FIG. 3 shows a circuit implementation of the slew boost disable circuit of FIG. 2 in accordance with an example.

FIG. 3 shows an example of the slew boost disable circuit 150. The illustrative slew boost disable circuit 150 includes a differential input voltage detect circuit 160, an output slew detection circuit 165, a slew boost interface A circuit 170, and a slew boost interface B circuit 175. The differential input voltage detect circuit 160 includes resistors R1 and R2, and transistors Q1 and Q2. The output slew detection circuit 165 includes transistors Q5-Q11, diodes D5 and D6, and capacitor C3. Slew boost interface A circuit 170 includes transistors Q12-Q15, current source I3, and bias voltage Vbias. Slew boost interface B circuit 175 includes transistors Q16-Q19 and current source I4. Further, the slew boost disable circuit 150 includes current source I1, diodes D1-D4, capacitors C1 and C2, and transistors Q3 and Q4. The transistors shown in the example of FIG. 3 comprise bipolar junction transistors but may include other transistor types if desired, such as metal oxide semiconductor field effect transistors (MOSFETs). References herein to any of the current sources "Ix" refer to either the current source device or the current level produced by the current source. For example, I1 may refer to the current source device or to the current I1 produced by the current source.

The differential input voltage detect circuit 160 comprises Q1 and Q2 coupled together in a differential arrangement. Q1 and Q2 comprise PNP transistors in this example. Each of Q1 and Q2 includes a control input (e.g., the base of the transistors). The control input of Q1 receives the input voltage Va, and the control input of Q2 receives the input voltage Vb. Resistor R1 couples to the emitter of Q1 and resistor R2 couples to the emitter of Q2. When Va is approximately equal to Vb, the current from current source I1 generally divides approximately evenly between one current path comprising R1 and Q1 and another current path comprising R2 and Q2.

The current division between Q1 and Q2 is an approximately linear function of the differential input voltage Va-Vb. The threshold noted in block 204 of FIG. 2 is implemented in the example of FIG. 3 by the sizing of current IQ1 (current through Q1) versus the quiescent currents IQ3 (current through Q3) and IQ4 (current through Q4, which depends on IQ2 (current through Q2)). IQ3 and IQ4 are sized to be approximately ¾ of I1. This means that (Va-Vb) must be large enough to steer at least 75% of I1 to one side (Q3 or Q4), instead of approximately evenly dividing I1 between Q1 and Q2 when Va approximately equals Vb. In one example, this condition (¾ of I1 is steered through one of Q3 or Q4) is reached for a differential input voltage of about 120 mV.

The collector of Q1 couples to the collector of Q3 and the collector of Q2 couples to the collector of Q4. The bases of transistors Q3, Q4, and Q5 are connected together with the base and collector of Q5 connected together as shown. In this arrangement, transistors Q3 and Q5 form one current mirror and transistors Q4 and Q5 form another current mirror. These two current mirrors share transistor Q5.

Diodes D1 and D2 are connected between the collector of Q3 and the bases of Q14 and Q18, with the anode of diode D1 and the cathode of diode D2 coupled to the collector of Q3, and the cathode of D1 and the anode of D2 coupled to the bases of Q14 and Q18. Similarly, diodes D3 and D4 are connected between the collector of Q4 and the bases of Q14 and Q18, with the anode of diode D4 and the cathode of diode D3 coupled to the collector of Q4, and the cathode of D4 and the anode of D3 coupled to the bases of Q14 and Q18. The collector of Q3 is coupled to capacitor C1 at node 162 and the collector of Q4 is coupled to capacitor C2 at node 163. Diodes D1-D4 ensure that the voltages at the collectors of Q3 and Q4 stay within one turn-on voltage of a diode (approximately 0.7V) from voltage Vbias.

As noted above, responsive to Va being approximately equal to Vb, the current from current source I1 divides approximately evenly between Q1 and Q2. Thus, approximately ½*I1 current flows through Q1 and approximately ½*I1 current flows through Q2. As will be explained below, the collector-to-emitter current through Q3 and Q4 is configured to be at a first level or at a second level with the second level being greater than the first level. The lower first level of current through Q3 is higher than the current through Q1 and Q2 (e.g., ½*I1) when Va is approximately equal to Vb. In that case, the current into node 162 from Q1 (IQ1) is less than the current through Q3 (IQ3), which causes capacitor C1 to discharge current into Q3 until the voltage at node 162 is approximately 0.7V below Vbias, which causes additional current to flow from diode D2. Consequently, the voltage on capacitor C1 at node 162 remains low. Similarly, the current through Q4 (IQ4) is the same as the current through Q3 (IQ3). As such, the current from Q2 (IQ2) is less than IQ4 and capacitor C2 discharges current into Q4 resulting in capacitor C2 discharging until the voltage on the capacitor at node 163 is approximately 0.7V below Vbias, which causes additional current to flow from diode D3. That both voltages on capacitors C1 and C2 at nodes 162 and 163, respectively, are low indicates that either Va is approximately equal to Vb or, if Va is not approximately equal to Vb, Vout is changing (i.e., slewing).

Referring to the output slew detection circuit 165, capacitor C3 receives the output voltage Vout on one of its plates. The other plate of C3 (node 166) couples to the cathode of diode D5 and to the anode of diode D6. Transistors Q6 and Q7 are configured as a current mirror. Transistors Q8 and Q9 and transistors Q10 and Q11 comprise cascode configurations. Thus, the output slew detection circuit 165 includes a multiple current mirror, cascode transistors, as well as Q5 which itself forms a current mirror in conjunction with Q3 and with Q4 as explained above.

Current source I2 is coupled to Q10. With Q6, Q8, and Q10 coupled together, the current through Q6, Q8, and Q10 is I2. Similarly, with Q7, Q9 and Q11 coupled together, the mirrored current flows through Q7, Q9, Q11 and Q5. For example, if the transistors are sized similarly, then the current through Q5 (IQ5) is approximately equal to I2. The transistors, however, may be sized differently in some embodiments, and thus IQ5 may be a scaled version of I2. In any case, I2 is set so that IQ5 is between ½*I1 and I1 (e.g., set to ¾*I1) when Vout is not slewing.

If Vout increases or decreases relative to the voltage on node 166, then C3 will either discharge current through diode D6 (when Vout increases above the voltage on node 166) or receive charging current through diode D5 (when Vout decreases below the voltage on node 166). In the case in which Vout increases, current from C3 flows through D6 and is added to the mirrored current flowing through Q11. This extra current also flows through Q5 and thus IQ5 increases to a level greater than ¾*I1. In one example, the current flowing through Q5 is greater than I1 (e.g., 1.5*I1) when Vout changes. Similarly, if Vout decreases below the voltage on node 166, current flows through diode D5 and the voltage on the base of Q7 is pulled down due to the current flowing through diode D5. As a result, Q7 is caused to open even more, which causes more collector current to flow through Q7. As a result, the current flowing through Q7, Q9 and Q11 increases and thus current to Q5 also increases. Regardless of whether Vout increases or decreases relative to the voltage on node 166, additional current is forced to flow through Q5. Due to the increase of IQ5, both IQ3 and IQ4 increase. As such, the level of current through Q3 and Q4 when Vout is slewing is greater than the level of current through Q3 and Q4 when Vout is not slewing.

If Va increases relative to Vb, Q1 closes thereby forcing all of I1 to flow through Q2. Similarly, if Vb increases relative to Va, Q2 closes thereby forcing all of I1 to flow through Q1. Thus, when Va and Vb are not approximately equal, most or all of I1 flows through one of Q1 or Q2. If IQ3 and IQ4 increase to a level greater than I1 (due to Vout changing as explained above), then whichever of IQ1 or IQ2 equals the full level of I1, that current is still less than IQ4 or IQ5 and capacitors C1 and C2 are still discharged to maintain the voltage on the capacitors C1 and C2 at a low level when Vout is slewing.

If Vout is not slewing, then IQ3 and IQ4 remain at the level between ½*I1 and I1 (e.g., ¾*I1). That current level is less than I1, and I1 current will flow through either of Q1 or Q2 depending on which of Va or Vb has risen above the other of Va or Vb. If, for example, IQ1 equals I1, then with IQ3 being less than I1, some of current I1 flows to capacitor C1 and causes capacitor C1 to charge thereby increasing its voltage. The same response occurs to charge capacitor C2 if IQ2 equals I1 and Vout is not slewing. Thus, with Vout not slewing, C1 is charged responsive to Vb being greater than Va, while C2 is charged responsive to Va being greater than Vb.

In operation, the output slew detection circuit 165 detects whether Vout is slewing and causes a current of, for example, approximately ¾*I1 to flow through Q3 and Q4 when Vout is not detected as slewing. Vout will not slew if (a) neither Va nor Vb is changing and Vout need not change due to a lack of change in Va or Vb or (b), Vout has slewed but has reached a power rail (at or near the maximum power supply voltage provided to the operational amplifier 100) and cannot change any more. If the output slew detection circuit 165 detects that Vout is not slewing, then the current mirror comprising Q3 and Q5 and the current mirror comprising Q4 and Q5 cause IQ3 and IQ4 to be approximately ¾*I1. If, however, Vout is slewing, IQ3 and IQ4 are increased to ensure that they are greater than I1, which will cause capacitors C1 and C2 to discharge themselves.

In one embodiment, the voltages on C1 and C2 may represent the BOOST_CTL control signal of the example of FIG. 1. The example of FIG. 3 includes slew boot interface A circuit 170 and slew boost interface B circuit 175 to convert the voltages on the capacitors C1 and C2 to signaling suitable to enable or disable the slew boost circuit 130 implemented in the operational amplifier 100. The circuitry of slew boot interface circuit A 170 and slew boost interface circuit B 175 is specific to the particular slew boost circuit 130 used and thus can be implemented differently for various implementations of slew boost circuits.

Vbias is coupled to the bases of Q14 and Q18. With respect to slew boost interface B circuit 175, Q18 and Q19 form a differential pair of transistors. When C2 is discharged, the base-to-emitter voltage Vbe of Q19 will be less than the Vbe of Q18 by the on-voltage of D3 (approximately 0.7V). With Vbe of Q19 being lower than the Vbe of Q18

(by about 0.7V), Q19 will be off and all of I4 flows through Q18, which is on. If, however, the voltage on C2 increases as explained above (due to Vout reaching a power rail while Va is not approximately equal to Vb), the Vbe of Q18 increases thereby turning on Q19, which causes the Vbe of Q18 to decrease thereby turning off Q18. The voltage on C2 will not exceed a diode voltage above Vbias due to the on-voltage of diode D4. As a result, the entire I4 either flows through Q18 when C2 is discharged, or through Q19 when C2 is charged. Q16 and Q17 form a current mirror and creates a current through Q17 that is a copy of the current through Q16. The current through Q16 (and thus through Q17) is either zero if Q19 is off (when C2 is discharged) or I4 (when C2 is charged). The current through Q17 can be used to enable or disable the current boost circuit 130. For example, the current through Q17 being low/off enables the current boost circuit 130, and the current through Q17 being high/I4 disables the current boost circuit 130. The configuration and operation of the slew boost interface A circuit 170 is similar to that of the slew boost interface B circuit 175, with diodes D1 and D2 used to clamp the voltage on the base of Q15 relative to Vbias.

In the example of FIG. 3, the slew boost interface circuits A and B 170, 175 are shown as part of the slew boost disable circuit 150. In other embodiments, slew boost interface circuits A and B 170, 175 are part of the slew boost circuit 130 itself.

Figure 4:
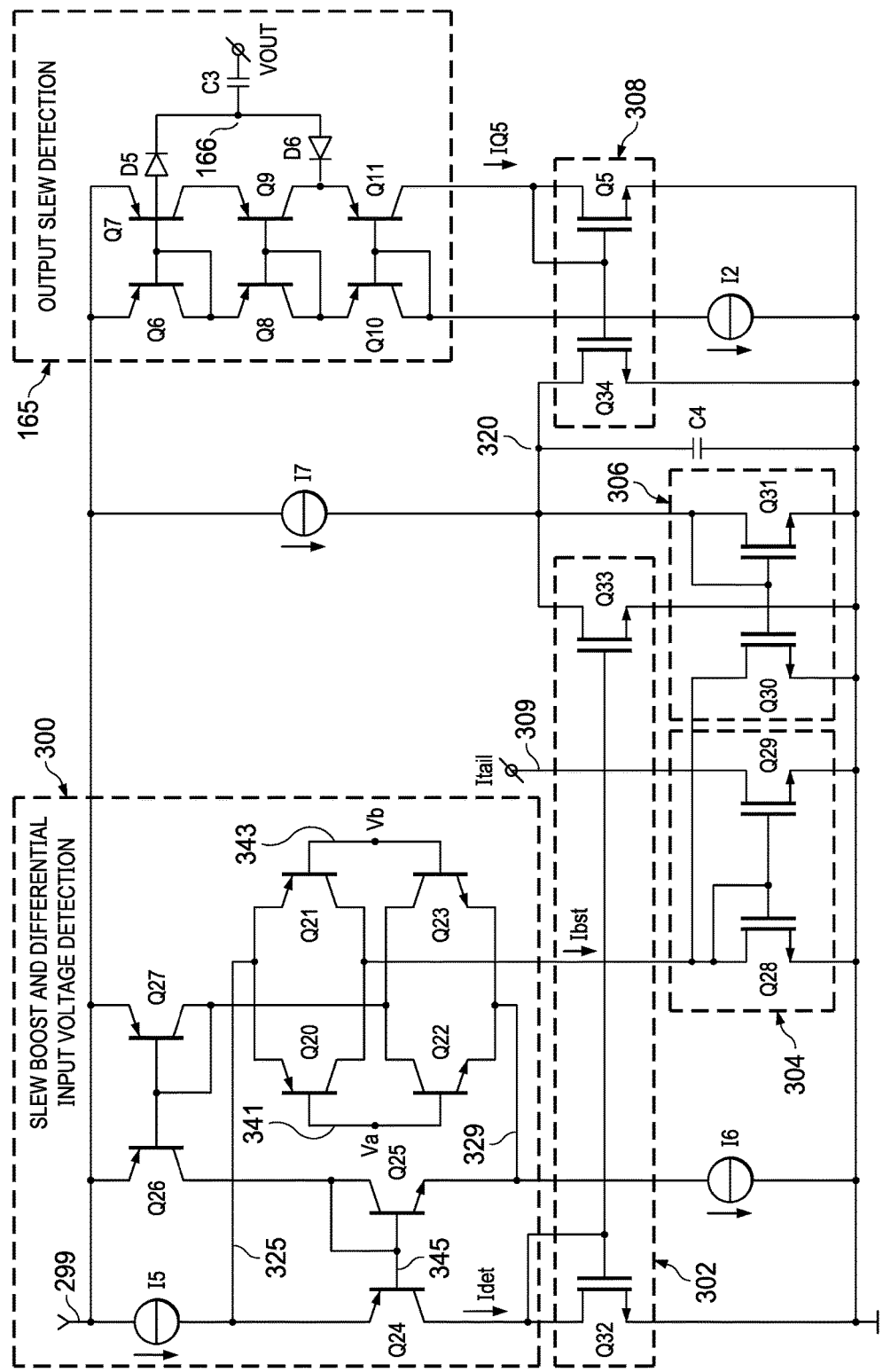
FIG. 4 shows a circuit for disabling slew boost operation in accordance with another example.

FIG. 4 shows another implementation for disabling slew boost operation when one input of the operational amplifier is more than a threshold different from the other input of the operational amplifier and the output voltage is not slewing. The example of FIG. 4 includes a slew boost and differential input voltage detection circuit 300 (also referred to as "slew boost circuit" 300), output slew detection circuit 165, current mirrors 302, 304, 306, and 308, and capacitor C4. In this example, the voltage on capacitor C4 at node 320 indicates the state of the operational amplifier as to whether the inputs to the operational amplifier Va and Vb are more than a threshold different from each other and whether the output voltage Vout is slewing. Specifically, when Va and Vb are not more than a threshold different from each other and/or Vout is slewing, the voltage on C4 is below a threshold voltage, but when Va and Vb are more than a threshold different from each other and Vout is not slewing, the voltage on C4 is forced to be greater than the threshold voltage. When the voltage on C4 is above the threshold voltage, slew boost operation is discontinued. Whereas the example of FIG. 3 used two capacitors C1 and C2 to represent the state of the operational amplifier, the example of FIG. 4 uses a single capacitor C4 to represent the state of the operational amplifier. The description of the slew boost and differential input voltage detection circuit 300 is described below followed by an explanation of how the slew boost operation of the slew boost and differential input voltage detection circuit 300 is disabled when the voltage on capacitor is above the threshold indicative of Va and Vb being more than a threshold different from each other and Vout is not slewing.

The slew boost and differential input voltage detection circuit 300 in FIG. 4 includes a current source I5 and transistors Q20-Q27. Current source I6 and transistors Q28 and Q29 are shown external to slew boost and differential input voltage detection circuit 300 but may be considered part of the slew boost and differential input voltage detection circuit 300.

As explained above and illustrated in FIG. 1, the operational amplifier 100 includes a differential input pair of transistors 110 which connect to the slew boos circuit 130.

The slew boost and differential input voltage detection circuit 300 of FIG. 4 also connects to the differential input stage of an operational amplifier at node 309. The current between the operational amplifier's input stage and the slew boost and differential input voltage detection circuit 300 is labeled as the Itail (tail current). When Va and Vb are more than a threshold different from each other, for instance due to a sudden input voltage step, the slew boost and differential input voltage detection circuit 300 causes Itail to increase thereby increasing the current through the differential input stage of the operational amplifier. When it is not necessary to boost the current through the input stage of the operational amplifier, the slew boost and differential input voltage detection circuit 300 causes Itail to be reduced.

The input voltages to the input stage of the operational amplifier (Va and Vb) are provide to the bases of transistors Q20/Q22 and Q21/Q23, respectively, as shown. Transistors Q20 and Q21 are PNP bipolar junction transistors (BJTs). Current source I5 is connected between a voltage source node 299 and the common emitters of transistors Q20 and Q21, and provides a current that is divided between transistors Q20, Q21, and Q24. The common collectors of transistors Q20 and Q21 are connected to the collector of a diode-connected NPN BJT transistor Q28. Transistors Q28 and Q29 form current mirror 304 which mirrors the current through transistors Q20 and Q21 through transistor Q29 to provide the tail current Itail for input differential input stage transistors of the operational amplifier (shown, for example, in FIG. 1). The base of Q28 is connected to the base of Q29, and the emitters of transistors Q28 and Q29 are connected to a ground node. When a differential signal Va, Vb is applied to the slew boost and differential input voltage detection circuit 300, that is, when the voltage at one of Va or Vb is higher than the other of Va or Vb, one of the transistors (e.g., Q20) conducts more of the current than the other transistor (e.g., Q21). At some point with a large differential signal, all of the available current will flow through just one of the input transistors (e.g., Q20).

The current source I5 provides a constant current that results in the highest desired slew-boosted tail current level through transistor Q29 during slewing conditions. In some example the current that is mirrored to the input stage of the operational amplifier is amplified in the transistors Q28 and Q29 of mirror 304 as a function of the ratio of the sizes of Q29 to Q29. For example, if transistor Q28 is sized at 1× and transistor Q29 at 20×, the current is amplified by a factor of 20. Thus, with a current source I5 producing 35 microamperes of current at full slewing conditions the current through the input transistors of the differential input stage of the operational amplifier (e.g., J1 and J2 of FIG. 1) will be about 700 microamperes. The use of a current mirror ratio to amplify the current in the input stage of the operational amplifier allows the slew boost and differential input voltage detection circuit 300 to run at a much lower current than the input stage of the operational amplifier resulting in lower power consumption.

The slew boost and differential input voltage detection circuit 300 includes a feedback loop that steals current from the current source I5 through transistor Q24 during normal (non-slewing) operation, limiting current through transistors Q20 and Q21 to normal levels. The emitter of PNP BJT transistor Q24 is connected to the current source I5 and the collector is connected to ground. During slewing conditions, the current from the current source I5 that flows through transistor Q24 is reduced or eliminated, increasing the current through one or both of transistors Q20 and Q21. A translinear loop in the slew boost and differential input voltage detection circuit 300 includes transistors Q20, Q21, Q24, Q25, Q22 and Q23.

The translinear loop in the slew boost and differential input voltage detection circuit 300 is controlled by the input voltages Va and Vb. The smaller of the two input voltages is tracked at node 329. The voltage at node 329 sets the base voltage of transistor Q24, and the voltage at node 325 sets the emitter voltage of transistor Q24. Thus, when the voltage at node 325 falls and/or the voltage at node 329 rises during slewing, the base-emitter voltage of transistor Q24 falls, reducing the portion of the current from current source I5 stolen through transistor Q24.

Node 329 tracks the larger of the Va and Vb input voltages using NPN BJT transistors Q22 and Q23. The emitters of transistors Q22 and Q23 are connected to node 329, which is connected to the emitter of transistor Q25 and to current source I6. The collectors of transistors Q22 and Q23 are connected to the voltage source node 299 through diode-connected transistor Q27. The base of transistor Q22 is connected to node 341, and the base of transistor Q23 is connected to node 343. The transistor Q22 or Q23 with the higher base voltage will conduct more current. For example, if input voltage Vb has a higher voltage than input voltage Va, the voltage at the base of the transistor Q23 driven by the Vb is higher than the voltage at the base of the transistor Q22 driven by Va. The transistor Q23 therefore conducts more current than transistor Q22. If the differential voltage between Va and Vb is large enough, all of the current through node 329 will flow through the transistor Q23 with the highest base voltage, and the other transistor Q22 will be turned off. With only the base-emitter junction of the conducting transistor Q23 between node 329 and node 343 which follows input voltage Vb, node 329 tracks the larger of the input voltages (Va or Vb) minus the base-to-emitted voltage of the conducting transistor Q23.

Node 325 tracks the smaller of the input voltages Va and Vb. The input voltage Va, Vb having the smaller voltage turns on its associated transistor Q20, Q21 more fully with a lower base voltage. This causes the transistor Q20 or Q21 with the lower base voltage to steal current from the current source I5 away from the transistor Q20 or Q21 with the higher base voltage. For example, if Va has a lower voltage than Vb, the voltage at the base of the transistor Q20 driven by Va is lower than the voltage at the base of the transistor Q21 driven by Vb. The transistor Q20 therefore conducts more current than transistor Q21, conducting more of the current from the current source I5. If the differential voltage between Va and Vb is large enough, all of the current from current source I5 will flow through that input transistor Q20 with the lower base voltage. This high differential voltage state also occurs when the Vout of the operational amplifier is slewing most rapidly, and this is when the slew boost and differential input voltage detect circuit 300 needs to increase the slew rate. Thus, node 325 will be equal to the minimum input voltage plus the base-to-emitter voltage of the conducting transistor Q20 or Q21, tracking the minimum input voltage (with a small offset) during the rapid slewing state.

The voltage at node 329 is carried to the base of transistor Q24 through diode-connected NPN BJT transistor Q25, plus the base-to-emitter voltage of the conducting transistor Q22, Q23. The emitter of transistor Q25 is connected to node 329, and the base and collector of transistor Q25 are connected to the base of transistor Q24. Thus, node 345 tracks the larger of Va and Vb, without the base-to-emitter offset. As node 329 rises due to a rising voltage at one of the differential inputs Va or Vb, node 345 rises as well, tracking the maximum input voltage.

The current through transistor Q24 is reduced either by a falling voltage at node 325 which lowers the emitter voltage of Q24 and thus decreases the base-to-emitter voltage of Q24, or by a rising voltage at node 329 which raises the base voltage (node 174) and thus decreases the base-to-emitter voltage of Q24. With either or both a falling smaller input voltage and/or rising larger input voltage, the base-to-emitted voltage of Q24 is decreased, restricting the current through Q24 and steering more of the current I5 through one or both transistors Q20 and Q21. In this way, when Va and Vb are slewing, more of the current from current source I5 is steered away from Q24 and through transistors Q20 and Q21 to increase the slew rate of the input stage of the operational amplifier.

Current source I6 is connected between ground and node 329 and provides a constant current which is divided between transistors Q22 and Q23 on one side and transistor Q25 on the other. In some embodiments, current source I6 provides a current of about 20 microamperes, although such current is not limited to this value. Note that as the voltage at node 329 rises, the base-to-emitter voltage of Q25 falls which begins to turns Q25 off and tends to decrease the proportion of the current from current source I6 that flows through Q25. To prevent this condition, a current mirror comprising diode-connected PNP BJT transistor Q27 and PNP BJT transistor Q26 evenly divides the current from current source I6 through transistor Q25 and the combination of transistors Q22 and Q23. The base and collector of transistor Q27 are connected to the base of transistor Q26 and to the common collectors of transistors Q22 and Q23. The emitters of transistors Q27 and Q26 are connected to voltage source node 299. The collector of transistor Q26 is connected to the collector of transistor Q25. With the current mirror comprising Q26 and Q27, the current through transistors Q22 and Q23 is about equal to the current through Q25, regardless of the changing base-to-emitter voltage of Q25. The emitter area of Q25 may be set large enough to carry the current which during normal operation is twice that carried by each of the transistors Q22 and Q22, although the current ratios are set by the current mirror comprising Q26 and Q27, and not the relative emitter areas of transistors Q25, Q22 and Q23.

The ratio of the current through the Q24 and through Q20 and Q21 can be set at least in part by the relative emitter areas of the transistors Q24, Q20 and Q21. If Q24 has a 5× emitter area and each of Q20 and Q21 has an emitter area of 1× (for a combined emitter area of 2×), during normal or quiescent operation most of the current from I5 flows through Q24 and the remaining current flows through transistors Q20 and Q21. Note that during normal operation of an operational amplifier, the high voltage gain along with an external feedback network ensures that the input voltages Va and Vb are at the same voltage, causing the current to be split equally between transistors Q20 and Q21. During slewing, Q24 turns off and the current in the input stage of the operational amplifier (see FIG. 1) rises. The slew boost and differential input voltage detection circuit 300 gently increases the current through the input stage in a substantially linear fashion as the voltage differential at the transistors Q20 or Q21 increases.

During operation, the current (labeled as Ibst) through Q28 increases if Va and Vb are more than a threshold voltage different from each other. Current mirror 304 comprising Q28 and Q29 responds by increasing the tail current Itail through the input stage of the operational amplifier.

As explained with reference to the example of FIG. 4, the current through Q5 (IQ5) increases if Vout is slewing and decreases if Vout is not slewing. Q34 and Q5 form current mirror 308. If Vout is not slewing, IQ5 reduces which causes less current to flow through Q34 Current source I7 provides current to node 320, which can be split through Q33, Q31, C4, and Q34. If IQ5 decreases (due to a lack of Vout slewing), then the current flow through Q34 decreases thereby resulting in a larger portion of the current from I7 to flow to capacitor C4 thereby increasing the charge and voltage on C4. As such, the voltage on node 320 increases.

Transistors Q32 and Q33 form current mirror 302. The current through Q24 is designated as Idet in FIG. 4. Idet is smaller (e.g., 0 amperes) if Va is more than a threshold different than Vb. Ordinarily, with Va being approximately equal to Vb, Idet will be a prescribed higher current level. Current mirror 302 causes a mirrored version of Idet to flow through Q33. Thus, a portion of I7 is permitted to flow through Q33 thereby steering current away from charging capacitor C4. However, if Idet reduces (e.g., becomes 0) due to Va being more than a threshold different than Vb, less current is caused to flow through Q33 (e.g., no current flows through Q33), and thus a larger portion of I7 is provided to capacitor C4 thereby increasing the voltage on node 320.

As such, the voltage on node 320 is reduced if Vout is slewing and/or Va and Vb are approximately equal. The voltage on node 320 is increased as a result of Vout not slewing and Va and Vb not being approximately equal. Once the voltage node 320 (which is provide to the drain of Q31) becomes larger than a diode voltage above the gate of Q31, current mirror 306 (comprising Q30 and Q31) turns on. With current mirror 306 enabled, the Ibst current is split between Q28 and Q30. As such, less Ibst current flows through Q28 and due to current mirror Q29, the Itail current reduces as well thereby reducing the extra current flow through the differential input transistors J1 and J2 (FIG. 1) of the input stage of the operational amplifier.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. An operational amplifier, comprising:
an input stage configured to receive a first input voltage and a second input voltage;
an output slew detection circuit configured to increase a first current responsive to slewing of an output voltage of the operational amplifier and to decrease the first current responsive to the output voltage not slewing;
a slew boost and differential input voltage detection circuit coupled to the input stage and configured to increase a second current responsive to a difference between the first and second input voltages;
a first capacitor coupled to the output slew detection circuit and the slew boost and differential input voltage detection circuit; and
a first current mirror coupled to the first capacitor, wherein a voltage on the first capacitor is configured to increase responsive to the first current from the output slew detection circuit increasing and separately responsive to the second current; and wherein the first current mirror is configured to be turned on responsive to the voltage on the first capacitor exceeding a threshold, and wherein once turned on, the first current mirror is configured to cause a third current of the input stage to decrease.

2. The operational amplifier of claim 1, further comprising a second current mirror including a first transistor coupled to the output slew detection circuit and a second transistor coupled to the first capacitor.

3. The operational amplifier of claim 2, further comprising a third current mirror including a third transistor configured to receive the second current and a fourth transistor coupled to the first capacitor.

4. The operational amplifier of claim 3, further comprising a fourth current mirror coupled to the slew boost and differential input voltage detection circuit and configured to generate the third current of the input stage.

5. The operational amplifier of claim 1, further comprising a current source coupled to the first current mirror.

6. The operational amplifier of claim 1, wherein the output slew detection circuit comprises:
a fifth current mirror;
a first diode coupled to the fifth current mirror;
a cascode transistor;
a second diode coupled to the cascode transistor; and
a second capacitor coupled to the first and second diodes and to the output voltage.

7. A circuit, comprising:
a first transistor configured to receive a first input voltage;
a second transistor configured to receive a second input voltage;
a first current mirror coupled to the first and second transistors;
a second current mirror coupled to the first current mirror;
a first capacitor coupled to the second current mirror;
a third current mirror coupled to the first capacitor; and
an output slew detection circuit coupled to the third current mirror, wherein the output slew detection circuit is configured to control a magnitude of a current through the third current mirror responsive to whether an output voltage of the circuit is slewing.

8. The circuit of claim 7, further comprising a current source coupled to the second current mirror.

9. The circuit of claim 7, further comprising a fourth current mirror coupled to the capacitor.

10. The circuit of claim 9, wherein the fourth current mirror is coupled to a third transistor that is configured to provide a current to the fourth current mirror responsive to a difference between the first input voltage and the second input voltage.

11. The circuit of claim 10, further comprising a current source coupled to the first capacitor, the second current mirror, the third current mirror, and the fourth current mirror.

12. The circuit of claim 7, wherein the output slew detection circuit comprises a first diode, a second diode, and a fifth current mirror coupled to the first diode.

13. The circuit of claim 11, wherein the output slew detection circuit comprises a cascode transistor coupled to the second diode and a second capacitor coupled to the first and second diodes.

14. The circuit of claim 7, wherein the first current mirror is configured to generate a current through an input stage of operational amplifier and wherein the second current mirror is configured to reduce the current through the input stage of the operational amplifier responsive to an output voltage of the operational amplifier not slewing and the first input voltage being more than a threshold different from the second input voltage.

15. A circuit, comprising:
an output slew detection circuit configured to increase a first current responsive to slewing of an output voltage of an operational amplifier and to decrease the first current responsive to the output voltage not slewing;
a slew boost and differential input voltage detection circuit configured to be coupled to an input stage of the operational amplifier and configured to increase a second current responsive to a difference between a first and second input voltages of the operational amplifier;
a first capacitor coupled to the output slew detection circuit and the slew boost and differential input voltage detection circuit; and
a first current mirror coupled to the first capacitor, wherein a voltage on the first capacitor is configured to increase responsive to the first current from the output slew detection circuit increasing and separately responsive to the second current; and
wherein the first current mirror is configured to be turned on responsive to the voltage on the first capacitor exceeding a threshold, and wherein once turned on, the first current mirror is configured to cause a third current of the input stage to decrease.

16. The circuit of claim 15, further comprising a second current mirror including a first transistor coupled to the output slew detection circuit and a second transistor coupled to the first capacitor.

17. The circuit of claim 16, further comprising a third current mirror including a third transistor configured to receive the second current and a fourth transistor coupled to the first capacitor.

18. The circuit of claim 17, further comprising a fourth current mirror coupled to the slew boost and differential input voltage detection circuit and configured to generate the third current of the input stage.

* * * * *